United States Patent [19]

Phelps

[11] Patent Number: 4,532,606
[45] Date of Patent: Jul. 30, 1985

[54] CONTENT ADDRESSABLE MEMORY CELL WITH SHIFT CAPABILITY

[75] Inventor: Andrew E. Phelps, San Diego, Calif.

[73] Assignee: Burroughs Corporation, Detroit, Mich.

[21] Appl. No.: 513,393

[22] Filed: Jul. 14, 1983

[51] Int. Cl.³ .............................................. G11C 15/04
[52] U.S. Cl. .................................... 365/49; 364/200; 364/900
[58] Field of Search ........................................ 365/49; 364/200 MS File, 900 MS File, 200, 900

[56] References Cited

U.S. PATENT DOCUMENTS

| | | | |
|---|---|---|---|
| 3,575,617 | 4/1971 | Burns | 365/49 |
| 3,868,642 | 2/1975 | Sachs | 365/49 |
| 4,168,541 | 9/1979 | DeKarske | 365/49 |
| 4,404,653 | 9/1983 | Ruhman | 365/49 |

Primary Examiner—Stuart N. Hecker
Assistant Examiner—Glenn A. Gossage
Attorney, Agent, or Firm—Charles J. Fassbender; J. Ronald Richbourg; Kevin R. Peterson

[57] ABSTRACT

A new and improved content addressable memory cell is disclosed, which cell stores data supplied on a load data input terminal thereof. The disclosed memory cell is adapted for comparing data supplied on a compare data input terminal thereof with data stored in the cell, and for supplying an output signal on a match data output terminal when the compare data is the same as the data stored in the cell. A latch circuit is employed as the storage element of the cell. First and second means are each coupled between a reference potential and the match data output terminal, which means are operative in response to the state of the latch circuit and the compare data supplied on the compare data input terminal.

6 Claims, 7 Drawing Figures

CONTENT ADDRESSABLE MEMORY CELL WITH SHIFT CAPABILITY

BACKGROUND OF THE INVENTION

The present invention generally relates to systems for translating virtual memory addresses into physical memory addresses, and more particularly to a new and improved content addressable memory (CAM) cell useful in such systems.

A content addressable memory is a memory device in which all memory cells are selected by contents rather than by addresses, which is also known as an associative memory.

It is an object of this invention to provide a high-speed content addressable memory device capable of being loaded in a shift register fashion.

Another related object of this invention is to provide a shiftable content addressable memory device that obviates address decode circuitry.

BRIEF SUMMARY OF THE INVENTION

A new and improved memory cell is provided for storing data supplied on a load data input terminal and this cell is adapted for comparing data supplied on a compare data input terminal with data stored in the cell and for supplying an output signal on a match data output terminal when the compare data is the same as the data stored in the cell. In particular, this memory cell comprises a latch circuit disposed for storing data, which circuit has a true output terminal coupled to the load data input terminal and a not true output terminal. A first means is coupled between the match data output terminal and a reference potential and is disposed for applying the reference potential to the match data output terminal in response to a comparison of the state of the latch circuit and the compare data. A second means is coupled between the match data output terminal and the reference potential and is disposed for applying the reference potential to the match data output terminal in response to a comparison of the state of the latch circuit and the inverse of the compare data.

DETAILED DESCRIPTION OF THE INVENTION

Figure 1:
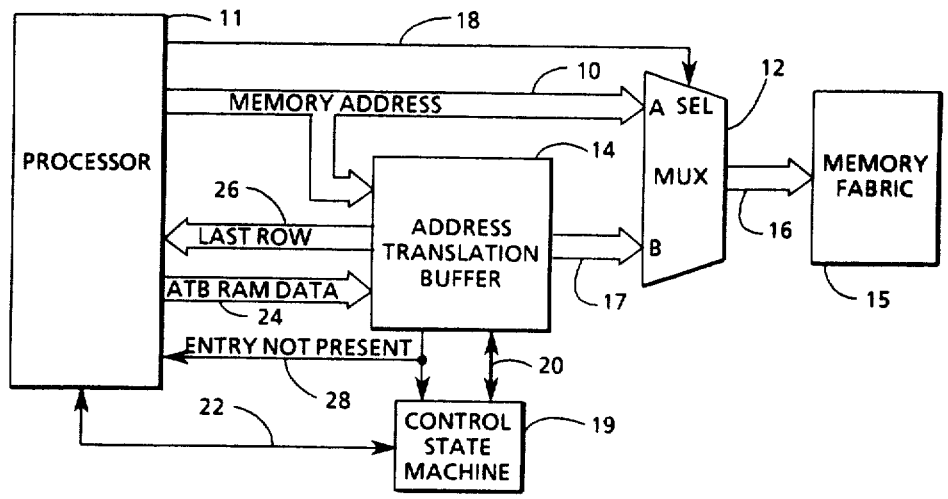
FIG. 1 is an overall block diagram of a system employing the present invention.

Referring now to the drawings, and in particular to FIG. 1, an overall block diagram of a portion of a memory interface device in which the present invention is useful is illustrated. A memory address bus 10 transmitting memory addresses from a processor 11 is coupled to the A input terminals of a multiplexer 12 and to input terminals of an address translation buffer 14. The address translation buffer (ATB) 14 is divided into three basic parts, which will be explained in greater detail hereinafter. A first part is a stack of rows of memory cells forming a content addressable memory (CAM), which is disposed for storing virtual addresses. A second part is a stack (equal in size to the CAM stack) of rows of memory cells forming a random access memory (RAM), which is disposed for storing physical addresses corresponding to the virtual addresses. The third part of the ATB 14 is a stack of an equal number of control circuits disposed for controlling read-in, readout or shifting operations to be explained hereafter.

The output terminals of the multiplexer 12 are coupled to a memory fabric 15 by means of a bus 16. It is the function of the memory address translation buffer 14 to translate virtual memory addresses into physical addresses, and the output terminals thereof are coupled to the B input terminals of the multiplexer 12 on a bus 17. The multiplexer 12 selects between either the A or the B input terminals by means of a control signal supplied on a line 18 from the processor 11.

The address translation buffer 14 is controlled by a control state machine 19 which is disposed for transmitting control signals to and from the buffer on lines 20. Control signals from the processor 11 are transmitted to the control state machine 19 on lines 22. Additional input and output signals to and from the address translation buffer 14, which will be more fully understood following the description hereinbelow, are the address translation buffer RAM data (i.e., ATB RAM DATA) supplied on a bus 24 from the processor 11, and the contents of the last row of cells (i.e., LAST ROW) within the buffer 14 supplied on a bus 26 to the processor. In addition, when an address translation comparison operation does not locate a desired address in any of the CAM cells within the buffer 14, a signal entitled ENTRY NOT PRESENT is supplied on a line 28 to the processor 11 and to the control state machine 19. It is noted that in practice, buses 10, 24 and 26 may be a single bus that is time shared by operation in a conventional manner. These buses are illustrated separately for explanation purposes only.

Physical addresses are loaded into the RAM portion of the ATB 14 on the bus 24, while corresponding virtual addresses are loaded into the CAM portion of the ATB by means of the bus 10. During operation, if a virtual address is transmitted on the bus 10, a comparison operation is performed within the CAM portion of the ATB 14 to locate a physical address stored in the RAM portion of the ATB. The physical address, if found, is supplied on the output bus 17 to the B input terminals of the multiplexer 12; and, from there to the memory fabric 15 on the bus 16 when the control signal on the line 18 is active. If no comparison match is found, then the ENTRY NOT PRESENT signal is supplied back to the processor 11 on the line 28.

Figure 2:
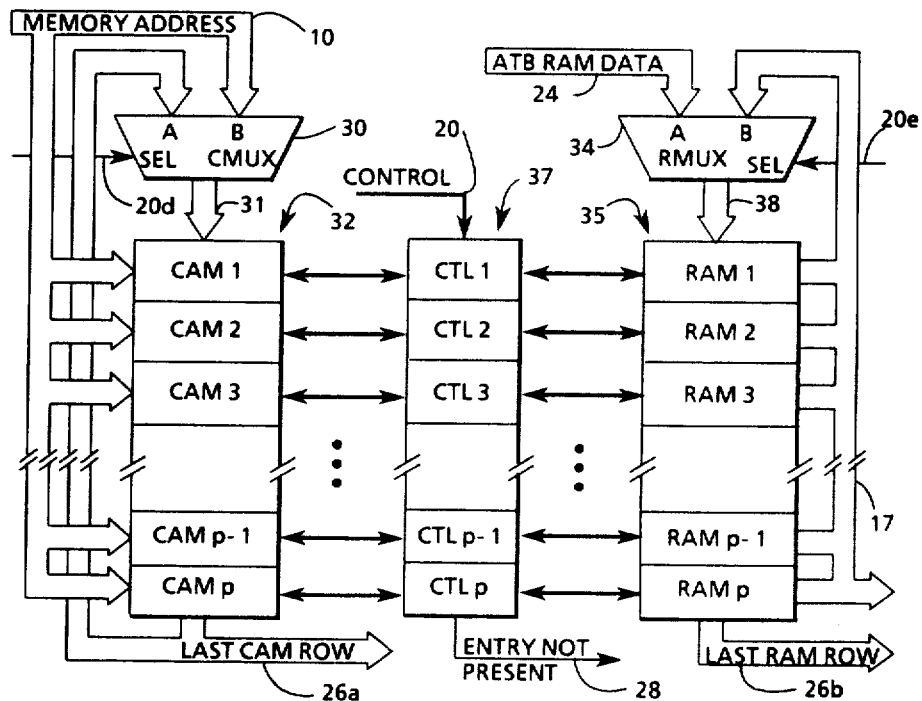
FIG. 2 is a detailed block diagram of the address translation buffer.

Referring now to FIG. 2, a block diagram of the address translation buffer 14 is illustrated. The memory address supplied on the bus 10 is applied to the B input terminals of a multiplexer referred to herein as CMUX 30. The output of the CMUX 30 is supplied on a bus 31 to the first row of the p rows of CAM cells (CAM 1) of a memory 32. The output of the last (p) row of CAM cells (CAM p) is coupled to an output bus 26a of the bus 26, and is also coupled back to the A input terminals of the CMUX 30. The CMUX 30 routes the signals on either the A or the B input terminals to the CAM 1 as a function of a SHUFFLE ALL control signal supplied on a line 20d of the lines 20.

In a like manner, the ATB RAM DATA bus 24 is coupled to the A input terminals of a multiplexer referred to herein as RMUX 34. The output of the RMUX is supplied on a bus 38 to the first row of p rows of RAM cells (RAM 1) of a memory 35. Outputs of each of the rows of RAM cells 1 through p are coupled to the bus 17, which is coupled back to the B input terminals of the RMUX 34. The output of the last (p) row of RAM cells (CAM p) is supplied on a bus 26b of the bus 26 for purposes to be described hereinafter. The RMUX 34 routes the signals on either the A or the B input terminals as a function of a LOAD RAM control signal supplied on a line 20e of the lines 20.

The shifting of the contents of the CAM cells of memory 32 row by row down the stack, or the RAM cells of memory 35 row by row down the stack, is controlled by a stack of p control circuits 37. Each of the control circuits 37 is coupled to respective ones of the rows of CAM and RAM cells. The control lines 20 from the control state machine 19 are provided as inputs to the stack of p control circuits 37, which will be explained in greater detail hereinafter. The output of the last, that is the pth control circuit, provides the ENTRY NOT PRESENT signal on the line 28.

Figure 3:
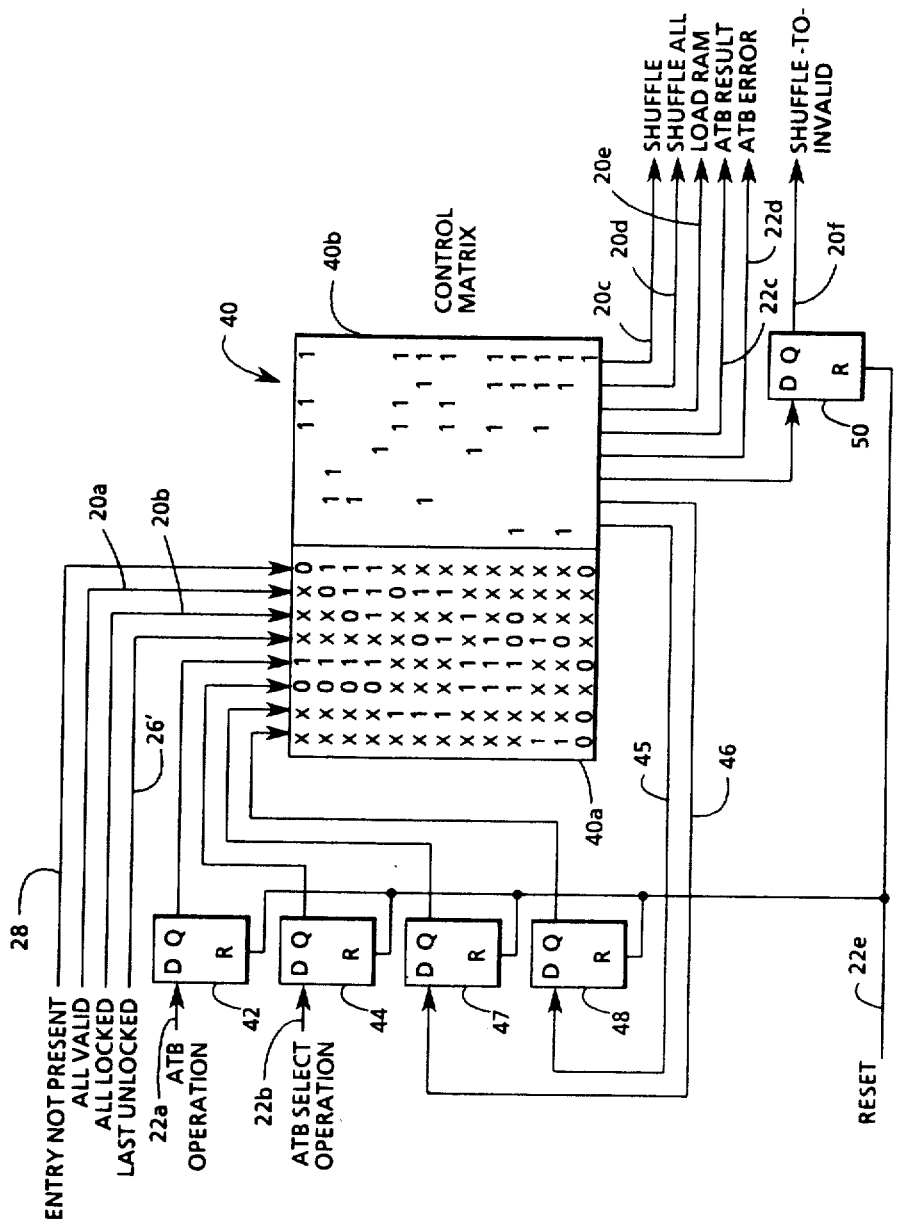
FIG. 3 is a schematic diagram of the control state machine.

In operation, the memory 32 contains p virtual addresses each being stored in a different row thereof. Similarly, the memory 35 contains p physical addresses each being stored in a different row thereof. Referring now to FIG. 3, the control state machine 19 is illustrated in greater detail. In it, an ATB SELECT OPERATION control signal is supplied on a line 22b of the control signal lines 22 to the data D input terminal of a flip-flop 44, which has the Q output thereof coupled to yet another address input terminal of the address portion 40a. Two output lines of the readout portion 40b, which are supplied on lines 46 and 45, are coupled to the data D input terminals of flip-flops 47 and 48, respectively. The Q output terminals of the flip-flops 47 and 48 are coupled to the last two address input terminals of the address portion 40a.

The control signals supplied on the lines 20 are provided at the output terminals of the readout portion 40b of the control matrix 40. These signals are referred to herein as SHUFFLE, SHUFFLE ALL, LOAD RAM, ATB RESULT, and ATB ERROR, and are supplied on lines 20c, 20d, 20e, 22c and 22d, respectively. A final output signal SHUFFLE-TO-INVALID is provided from the Q output terminal of a flip-flop 50 on a line 20f, which has the data D input thereof coupled to an output terminal of the readout portion 40b. The reset (R) input terminals of the flip-flops 42, 44, 47, 48 and 50 are coupled to a line 22e transmitting a RESET signal from the processor 11.

In operation, when the combination of input signals matches those in a single row of the address portion, the numbers in the same row are read out from the readout portion. For example, if the state of the input, reading left to right across the top of the address portion 40a, were to be XX01XXX0, the output would be as follows: a high level signal on the line 20c (SHUFFLE), a high level signal on the line 20e (LOAD RAM), and a high level signal on the line 22c (ATB RESULT). The letter X, as used herein, refers to a don't care situation. Each of the remaining rows operates in a similar manner.

Figure 4:
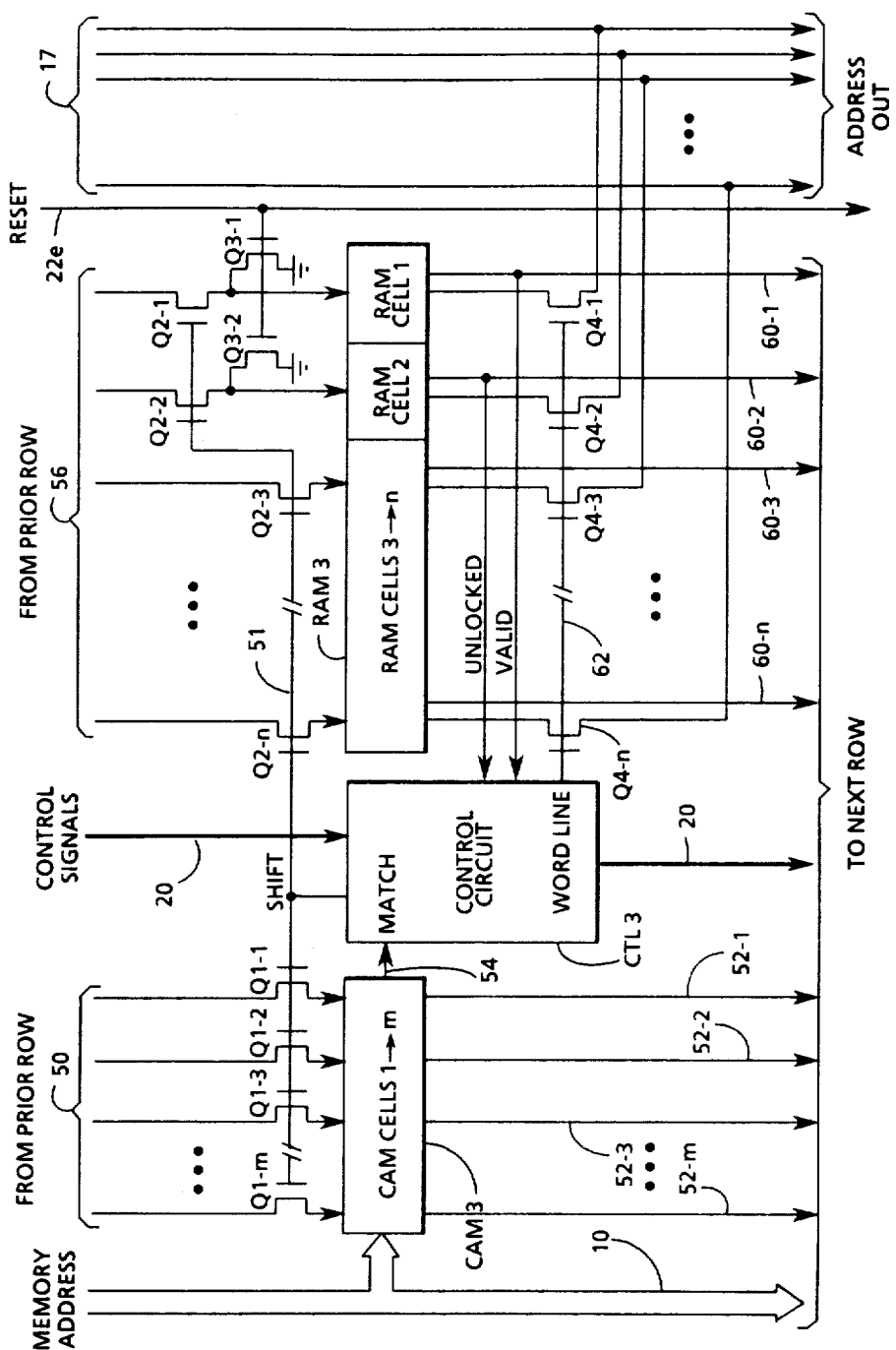
FIG. 4 is a schematic diagram illustrating details of one row of memory cells.

Referring now to FIG. 4, details of row 3 of the ATB structure are illustrated. The memory address supplied on the bus 10 from the processor 11 (FIG. 1) is coupled to the CAM 3 cells 1 through m. The virtual address to be stored in the CAM 3 is supplied on lines 50 to drain terminals of transistors Q1-1 through Q1-$m$. For the first row of CAM cells, i.e. CAM 1, the lines 50 would be the same as the bus 31 from the CMUX 30. The source terminals of the transistors Q1-1 through Q1-$m$ are coupled to inputs of the CAM cells 1 through m. The gate terminals of these transistors are coupled to a line 51, which transmits a SHIFT signal provided by a control circuit CTL 3. At this juncture of the description, it should be pointed out that the terms source and drain are used herein as a matter of convenience only. In semiconductor practice today, MOS and CMOS transistors are typically fabricated symmetrical. Moreover, in the disclosed embodiment, a high level voltage is +5 volts and a low level voltage is ground potential (zero volts). Furthermore, the reference numerals used for the transistors shown relate to only the illustrated row of memory cells (i.e., row 3), and it being understood that the other rows (not shown) also have transistors configured in the same way as that illustrated in FIG. 4.

The memory address supplied on the bus 10 to the CAM 3 is the address to be compared with the contents of the CAM cells 1 through m of row 3. The contents of the CAM cells 1 through m are loaded by means of the lines 50 in response to a SHIFT signal. In a similar manner, the contents of the CAM cells 1 through m in the CAM 3 are supplied to the next row of CAM cells by means of lines 52-1 through 52-$m$. When a memory address supplied on the bus 10 matches the contents of one single row of CAM cells such as row 3, a MATCH signal is supplied on a line 54 to the control circuit CTL 3 from the CAM 3.

The contents of the RAM cells in the stack 35 are transmitted from the previous row to row 3 by means of lines 56, which lines are coupled to the drain terminals of transistors Q2-1 through Q2-$n$. For the first row of RAM cells, i.e. RAM 1, the lines 50 would be the same as the bus 38 from the RMUX 34. The source terminals of the transistors Q2-1 through Q2-$n$ are coupled to the RAM cells 1 through n of the RAM 3. The gate terminals of these transistors are also coupled to the SHIFT line 51. The RAM cells 1 and 2 of the RAM 3 have an additional function to be explained further hereinafter, and accordingly, transistors Q3-1 and Q3-2 are coupled between the inputs to the RAM cells 1 and 2, respectively, and ground potential. The gate terminals of the transistors Q3-1 and Q3-2 are coupled to the RESET signal line 22e. Hence, when the RESET signal is at a high level, the transistors Q3-1 and Q3-2 are turned on thereby grounding the inputs to the RAM cells 1 and 2, which sets a zero in these cells.

The output or contents of the RAM 3 cells are transmitted to the next row by means of lines 60-1 through 60-$n$. In addition, the line 60-1 is coupled to an input terminal of the control circuit CTL 3 and is also identified as VALID. Similarly, the line 60-2 is also coupled to an input terminal of the control circuit CTL 3 and is also identified herein as UNLOCKED. Hence, the RESET signal going high forces a low-level signal on the lines 60-1 and 60-2, which causes the UNLOCKED and VALID signals to go low. The content readout of the RAM cells in the RAM 3 row is provided at the drain terminals of transistors Q4-1 through Q4-$n$. The source terminals of the transistors Q4-1 through Q4-$n$ are coupled to the bus 17, which transmits the address output to the MUX 12 (FIG. 1). The gate terminals of the transistors Q4-1 through Q4-n are coupled to a word line 62 from the control circuit CTL 3.

Figures 5, 6:
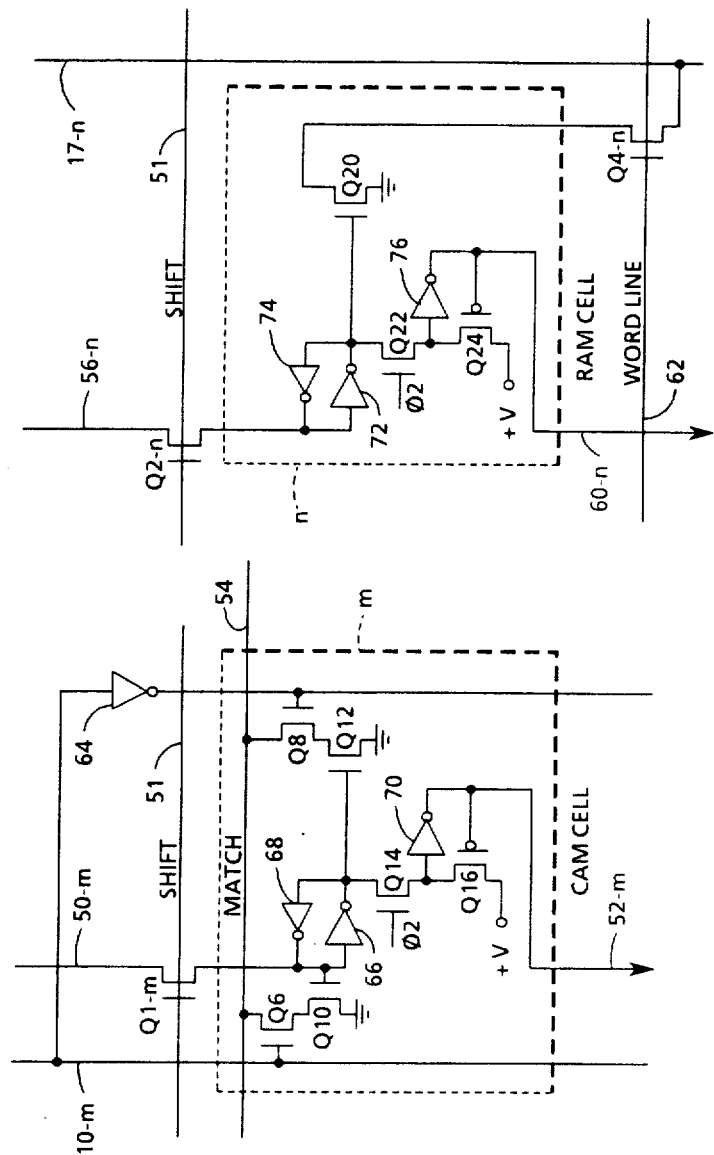
FIG. 5 is a schematic diagram of a typical content addressable memory cell in accordance with the present invention.
FIG. 6 is a schematic diagram of a typical random access memory cell.

Referring now to FIG. 5, an individual CAM cell such as the cell m will be described. In this cell, a line 50-m of the lines 50, which transmits load data from the previous row CAM cell, is coupled to the drain terminal of a transistor Q1-m and the source terminal thereof is coupled to the gate terminal of the transistor Q10, the input of an inverter 66, and to the output of yet another inverter 68. The gate terminal of the transistor Q1-m is coupled to the SHIFT line 51. Hence, when the SHIFT signal is at a high level the state of the previous row CAM cell is transferred to the cell m at the input of the inverter 66. The inverters 66 and 68 form a latch circuit, wherein the inverter 68 is scaled smaller than the inverter 66 so as to enable the load data from the prior row to override the inverter 68 when changing the state of the CAM cell.

The output of the inverter 66 is coupled to the gate terminal of the transistor Q12 and to the input of the feedback inverter 68. The output of the feedback inverter 68 is coupled back to the input of the inverter 66, thereby forming the latch circuit. Also, the output of the inverter 66 is coupled to the drain terminal of a transistor Q14 having a gate terminal thereof coupled to a $\phi_2$ clock input signal. There are two clock signals $\phi_1$ and $\phi_2$ discussed herein, and each is complementary to the other and they are non-overlapping. These clock signals are generated in a well-known manner not shown herein. The source terminal of the transistor Q14 is coupled to the input of an inverter 70 and to the drain terminal of a p-channel transistor Q16 having the drain terminal thereof coupled to a source of positive voltage ($+V$). The output of the inverter 70 is the output of the CAM cell m and is coupled to a line 52m of the bus 52. Also, the output of the inverter 70 is coupled to the gate terminal of the p-channel transistor Q16. It is noted that when the transistor Q16 is a p-channel transistor, all other transistors would be n-channel. However, a reverse in polarity of the various transistors described herein could be made without departing from the spirit of the invention.

The output of the inverter 66 is at a high or a low level depending upon the state of the CAM cell m. Assume, for example, that the output of the inverter 66 is at a high level which would turn on the transistor Q12. If the state of the line 10-m is also at a high level (which would mean that for purposes of an individual cell there would be a match), the output of the inverter 64 would be at a low level thereby turning off the transistor Q8. Similarly, the transistor Q6 would be turned on; however, the transistor Q10 would be turned off since the output of the inverter 68 is opposite to the output of the inverter 66 (i.e., a low level). Accordingly, the MATCH signal line 54 remains at a high level since the line 54 is biased at a preselected voltage level in a conventional well-known manner.

If the state of the CAM cell m is to be changed by shifting into this cell or row of cells from the previous cell or row of cells, the SHIFT signal line 51 is raised to a high level and the state of the line 50-m (i.e., the state of the corresponding cell in the previous row) would be transmitted to the input of the inverter 66. Let's assume, for purposes of discussion, that the state of the line 50-m is at a high level. Then, this high-level signal is applied to the input of the inverter 66 when SHIFT is high, thereby dropping the output of this inverter to a low level. This low-level signal is coupled back through the inverter 68 to a high level, which locks the cell m in a one state. Upon the application of a $\phi_2$ clock signal to the gate terminal of the transistor Q14, the state of the inverter 70-transistor Q16 buffer circuit will be changed according to the state of the latch circuit (inverters 66 and 68).

FIG. 6 illustrates in greater detail an individual RAM cell such as RAM cell n. In a similar manner, the state of the previous RAM cell is present on the line 56-n of the lines 56 and is coupled through the transistor Q2-n when a SHIFT signal is high on the line 51. This state is applied to the input of an inverter 72 and the output thereof is coupled to the input of yet another feedback inverter 74, to the gate terminal of a transistor Q20 and to the drain terminal of a transistor Q22. The gate terminal of the transistor Q22 is coupled to the $\phi_2$ clock signal line. In a similar manner the inverter 74 is scaled smaller than the inverter 72, and these inverters form a latch circuit.

The gate terminal of the transistor Q4-n is coupled to the word line 62 and the drain terminal thereof is coupled to line 17-n of the bus 17 as was illustrated in FIG. 4 and described hereinabove. The source terminal of the transistor Q4-n is coupled to the drain terminal of the transistor Q20 and the source terminal thereof is coupled to ground potential. The transistors Q20 and Q4-n form an open drain NAND gate.

The source terminal of the transistor Q22 is coupled to the input terminal of an inverter 76 and the output thereof is coupled to the gate terminal of a p-channel transistor Q24 having the drain terminal thereof coupled to a voltage source ($+V$). The source terminal of Q24 is coupled back to the input terminal of the inverter 76. The output of the inverter 76 is also coupled to the line 60-n, which line is coupled to the next row of RAM cells as was illustrated in FIG. 4 and described hereinabove. The inverter 76 and the transistor Q24 form a buffer circuit.

In operation, when a high level signal is supplied on the word line 62, the transistor Q4-n is turned on and if the transistor Q20 is on, the line 17-n is pulled down to ground potential. The transistor Q20 would be turned on in response to a high-level signal at the output of the inverter 72, which indicates that the RAM cell is in a one state. On the other hand, if the output of the inverter 72 is at a low level (RAM cell in a zero state), the transistor Q20 is turned off and the line 17-n remains at its biased level. Each of the lines 17 are biased at a preselected voltage level in a conventional well-known manner.

Figure 7:
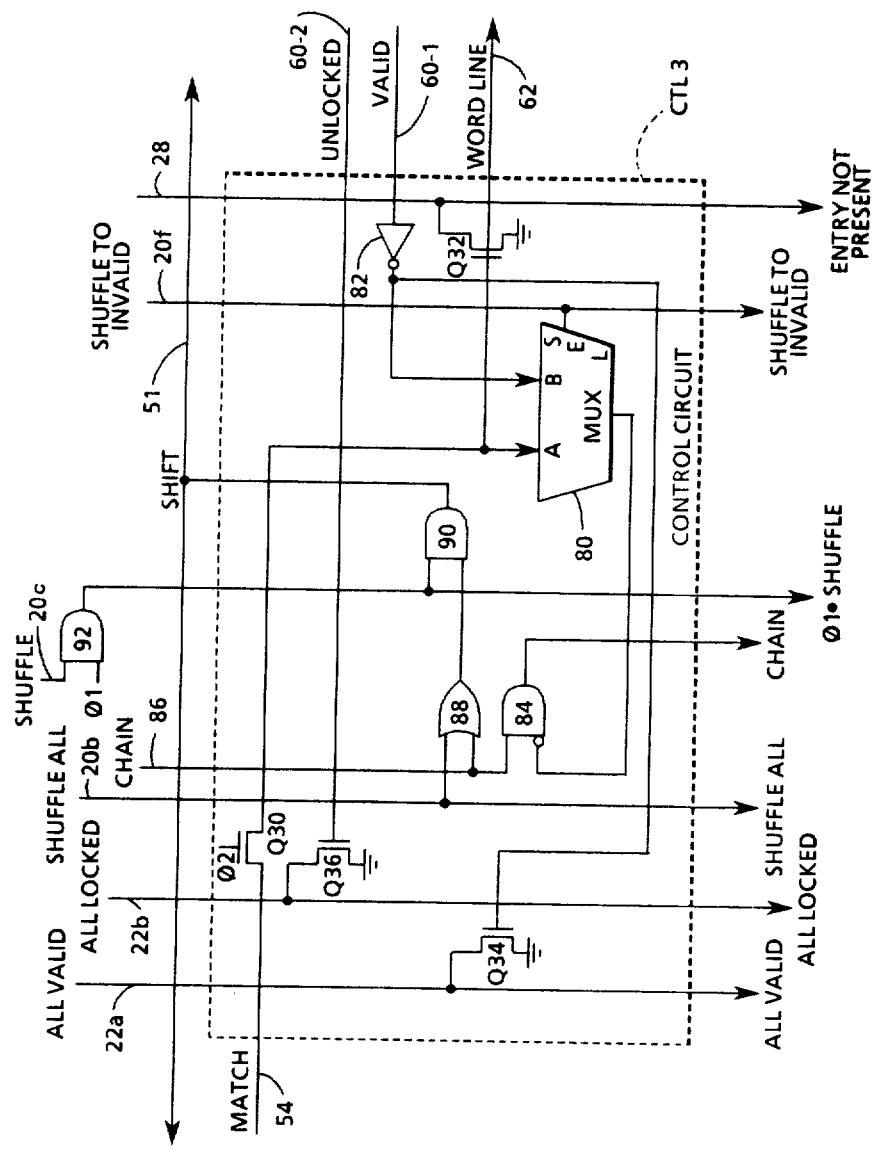
FIG. 7 is a schematic diagram of a typical row control circuit.

Referring now to FIG. 7, details of the control circuit such as CTL 3 are illustrated in greater detail. The MATCH signal line 54 is coupled to the drain terminal of a transistor Q30 and the source terminal thereof is coupled to the A input terminal of a multiplexer 80, to the gate terminal of another transistor Q32 and to the word line 62. The gate terminal of the transistor Q30 is coupled to the $\phi_2$ clock signal. The drain terminal of the transistor Q32 is coupled to the ENTRY NOT PRESENT signal line 28 and the source terminal thereof is coupled to ground potential. The VALID signal line 60-1 is coupled to the input terminal of an inverter 82 and the output of the inverter 82 is coupled to the B input terminal of the multiplexer 80 and to the gate terminal of a transistor Q34. The drain terminal of the transistor Q34 is coupled to the ALL VALID signal line 22a and the source terminal thereof is coupled to ground potential. The ENTRY NOT PRESENT, ALL LOCKED and the ALL VALID signal lines are biased at a preselected voltage level in a conventional well-known manner. The SHUFFLE-TO-INVALID signal line 20f is coupled to the SELECT input terminal of the multiplexer 80 and the output terminal of the multiplexer 80 is coupled to an inverting input terminal of an AND gate 84. When the SHUFFLE-TO-INVALID signal is at a high level, the B input terminal is selected and when at a low level, the A input terminal of the multiplexer 80 is selected.

A CHAIN signal, which is used in a shuffle-to-match and shuffle-to-invalid operations to be described further hereafter, is supplied on a line 86 to a first of two input terminals of an OR gate 88 and to the second input terminal of the AND gate 84. The output of the AND gate 84 couples the CHAIN signal to the next row control circuit. The SHUFFLE-ALL signal supplied on the line 20b is coupled to the second input terminal of the OR gate 88, and the output terminal of the OR gate 88 is coupled to one of two input terminals of an AND gate 90. The SHUFFLE signal supplied on the line 20c and the $\phi_1$ clock signal are applied to the two input terminals of an AND gate 92 and the output terminal of this AND gate is coupled to the second input terminal of the AND gate 90, which output terminal is also disposed for connection in the subsequent row control circuit. Refer to FIG. 3, and the right-most column of the readout portion 40a of the control matrix 40 for signal combinations producing a high-level state of the SHUFFLE signal. The output terminal of the AND gate 90 is coupled to the line 51 transmitting the SHIFT signal as described hereinabove. Note that the $\phi_1$ clock signal forms part of the SHIFT signal, while the actual transfer of data from the prior row is controlled by the $\phi_2$ clock signal (FIG. Q14 and FIG. 6 Q22). This arrangement assures stability of operation.

The UNLOCKED signal supplied on the line 60-2 is coupled to the gate terminal of a transistor Q36 having the drain terminal thereof coupled to the ALL LOCKED signal line 22b and the source terminal thereof coupled to ground potential.

When a MATCH signal is supplied on the line 54 and when the $\phi_2$ clock signal is at a high level, the word line 62 is raised to a high level which turns on the transistor Q32. The transistor Q32 turning on grounds the ENTRY NOT PRESENT signal line 28 which indicates that an entry is present in the ATB 14.

At this juncture of the description, reference is made to FIGS. 2, 3 and 7 for aid in explaining the various shuffle operations. Assume that during the search of the memory 32, a matching virtual address is located in the CAM 3 row of cells. By means of the MATCH signal supplied on the line 54 to the control circuit CTL 3 the contents of the RAM 3 row of cells is read out on the bus 17 and simultaneously loaded into the RAM 1 row of cells. It is therefore necessary to perform a shuffle-to-match operation. The information that was in the first row of cells is loaded into the second row of cells while the information that was in the second row of cells is loaded into the third row of cells.

In order to perform the shuffle-to-match operation, it is necessary to enable the AND gate 90 by enabling the OR gate 88 and the AND gate 92. In the first row control circuit CTL 1, the CHAIN signal line is tied to a high level voltage. Continuing with the example above, a MATCH signal on the line 54 produces a high-level signal on the WORD LINE 62 when the $\phi_2$ clock signal is high, which also appears at the A input terminal of the multiplexer 80. The ENTRY NOT PRESENT signal line is pulled down to ground potential by the transistor Q32. The SHUFFLE-TO-INVALID signal line 20f is at a low level for all operations except where performing a LOAD ATB operation in which there is no match and in which an INVALID entry is present in the ATB. Accordingly, the high-level signal at the A input terminal of the multiplexer 80 is provided at the output terminal thereof and causes the AND gate 84 to be disabled. Hence, the CHAIN signal is not passed on to the fourth row of CAM and RAM cells, but was coupled between the first three rows for enabling the AND gate 90 thereby providing the SHIFT signal.

With brief reference to FIG. 4, the RAM CELLs 1 and 2 are reset to zero in response to a RESET signal on the line 22e. When a row of CAM and RAM cells are loaded with a virtual and physical address, respectively, the RAM CELL 1 is set to a one thereby indicating a valid address is stored in that row. If, on the other hand, nothing has been loaded into a row of CAM and RAM cells, or data that has been loaded into a row of memory cells that has been explicitly denoted as invalid, the RAM CELL 1 will be set to zero, then the VALID line 60-1 will be at a low level.

Under the above state of the signals, the output of the inverter 82 (FIG. 7) would be at a high level and if the SHUFFLE-TO-INVALID signal on the line 20f is at a high level, then the output of the inverter 82 is passed through the multiplexer 80 to disable the AND gate 84. For the next row of cells, the CHAIN signal is blocked. Hence, a shuffle operation is performed through the row having the invalid address.

As described hereinabove, the least recently used address gravitates to the last row by virtue of each accessed address being relocated to the first row, while shuffling all other stored addresses down one row. If it is necessary to store another virtual-physical address pair, and there is no more space in the ATB, a decision is to be made by the processor 11 as to whether or not to erase the least recently used address in the last row of cells. To assist in this operation, a virtual-physical address pair may be assigned a locked status bit which would prevent erasure. This status bit is stored in the RAM CELL 2 and the signal on this CELL's output line 60-2 is referred to herein as UNLOCKED.

If the address pair stored in the last (pth) row of cells is either an INVALID or a LOCKED address, then it is automatically cycled (during an idle time period) up to the first row and all rows are shuffled down one row by use of the SHUFFLE ALL signal.

The foregoing description of a system and logical circuit implementation are intended to be explanatory of a content addressable memory cell with reference to use in an address translation buffer. It will be understood from the foregoing that various changes may be made in the preferred embodiment illustrated herein, and it is intended that the foregoing materials be taken as illustrative only and not in a limiting sense. It is therefore intended that the scope of the invention is defined by the following claims.

We claim:

1. A memory cell for storing data provided on a load data input terminal and being adapted for comparing data supplied on a compare data input terminal with data stored in said cell and for supplying an output signal on a match data output terminal when the compare data is the same as the data stored in the cell, said memory cell comprising:
  a. a latch circuit for storing data and having a true output terminal coupled to said load data input terminal and a not true output terminal;
  b. first means coupled between said match data output terminal and a reference potential and being disposed for applying the reference potential to said match data output terminal in response to a comparison of the state of said latch circuit and the compare data;
  c. second means coupled between said match data output terminal and said reference potential and being disposed for applying the reference potential to said match data output terminal in response to a comparison of the inverse state of said latch circuit and the inverse of the compare data;
  d. said latch circuit further comprising a pair of inverters each of which has an output coupled to the input of the other inverter and wherein one of said inverters is scaled smaller than the other so that the state of said latch circuit is modifiable by changing the state of the true output terminal of said latch circuit; and
  e. a transistor means serially coupled to said load data input terminal and being responsive to a shift signal when loading data into said memory cell.

2. A system including P rows by M columns of content addressable memory cells, wherein P and M are integers greater than one, each of said memory cells comprising:
  a. a latch circuit for storing data and having a not true output terminal and a true output terminal coupled to a first input terminal disposed for receiving data;
  b. first means coupled between a match data output terminal and a reference potential and being disposed for applying the reference potential to said match data output terminal in response to a comparison of the state of said latch circuit and compare data supplied on a second input terminal;
  c. second means coupled between said match data output terminal and said reference potential and being disposed for applying the reference potential to said match data output terminal in response to a comparison of the inverse state of said latch circuit and the inverse of the compare data; and
  d. each of said memory cells after said first row further including a transistor means serially coupled to said first input terminal and being operative in response to a shift signal for loading data from the memory cell of the same column in the preceding row.

3. A system as in claim 2 wherein said latch circuit of each of said memory cells comprises a pair of inverters each of which has an output coupled to the input of the other inverter and wherein one of said inverters is scaled smaller than the other so that the state of said latch circuit is modifiable by changing the state of the true output terminal of said latch circuit.

4. A system as in claim 2 wherein the output of the last (Pth) row of memory cells is coupled through a multiplexer means to the input of the first row of memory cells.

5. A memory cell for storing data provided on a load data input terminal and being adapted for comparing data supplied on a compare data input terminal with data stored in said cell and for supplying an output signal on a match data output terminal when the compare data is the same as the data stored in the cell, said memory cell comprising:
  a. a latch circuit for storing data and having a true output terminal coupled to said load data input terminal and a not true output terminal;
  b. first means coupled between said match data output terminal and a reference potential and being disposed for applying the reference potential to said match data output terminal in response to the presence of a high voltage level on the true terminal of said latch circuit and a high voltage level of the compare data;
  c. second means coupled between said match data output terminal and said reference potential and being disposed for applying the reference potential to said match data output terminal in response to the presence of a high voltage level on the not true terminal of said latch circuit and a low voltage level of the compare data; and
  d. a transitor means serially coupled to said load data input terminal and being operative in response to a shift signal when loading data into said memory cell.

6. A memory cell as in claim 5 wherein said latch circuit comprises a pair of inverters each of which has an output coupled to the input of the other inverter and wherein one of said inverters is scaled smaller than the other so that the state of said latch circuit is modifiable by changing the state of the true output terminal of said latch circuit.

* * * * *